United States Patent
Chen

(10) Patent No.: US 6,664,835 B1
(45) Date of Patent: Dec. 16, 2003

(54) PHASE SPLITTER

(75) Inventor: Yung-Hung Chen, Junghe (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/289,359

(22) Filed: Nov. 7, 2002

(51) Int. Cl.$^7$ .......................... H03H 11/16; H03K 3/00
(52) U.S. Cl. ........................ 327/258; 327/245
(58) Field of Search ................ 327/231–234, 327/236–245, 250–259

(56) References Cited

U.S. PATENT DOCUMENTS

| | | | | |
|---|---|---|---|---|
| 5,767,756 A | * | 6/1998 | Hwang | 327/255 |
| 5,942,929 A | * | 8/1999 | Aparin | 327/233 |
| 6,292,042 B1 | * | 9/2001 | Kim et al. | 327/257 |
| 6,356,131 B1 | * | 3/2002 | Kuwano | 327/255 |
| 6,420,920 B1 | * | 7/2002 | Huber et al. | 327/257 |

* cited by examiner

Primary Examiner—My-Trang Nuton
(74) Attorney, Agent, or Firm—Rabin & Berdo, P.C.

(57) ABSTRACT

A phase splitter. The splitter includes a transistor having a gate receiving an input signal, a drain and source outputting a first and second output signal with a first and second phase, respectively, a current source providing a current flowing from the drain to the source of the transistor, and a feedback tuning circuit receiving the first and second output signal, and tuning the current according to the first and second phase.

11 Claims, 6 Drawing Sheets

PHASE SPLITTER

BACKGROUND OF THE INVENTION

1. Field of the Invention

The present invention relates to a phase splitter and particularly to a phase splitter with active load and feedback tuning circuit.

2. Description of the Prior Art

FIG. 1 is a diagram showing a conventional phase splitter. It includes a transistor M, resistors Rd and Rc, and a capacitor Cc. The source of the transistor M is coupled to the resistor Rc. The drain of the transistor M is coupled to the resistor Rd. The gate of the transistor M is coupled to receive an input signal IN. The resistors Rc and Rd are also coupled to receive a power supply voltage Vss and Vdd respectively. The two ends of the capacitor Cc are respectively coupled to the source of the transistor M and to receive the voltage Vss. Output signals OUT1 and OUT2 are output from the drain and source of the transistor M respectively.

The phase difference of the output signals OUT1 and OUT2 is determined by the resistors Rc and Rd, and the capacitor Cc.

However, in the conventional phase splitter, a relatively large circuit area is needed due to the passive load and it is difficult to tune the phase difference between the output signals.

SUMMARY OF THE INVENTION

The object of the present invention is to provide a phase splitter with active load and feedback tuning circuit, which uses a small circuit area, generates a more precise and tunable phase difference.

The present invention provides a phase splitter comprising a transistor having a gate receiving an input signal, a drain and source outputting a first and second output signal with a first and second phase, respectively, a current source providing a current flowing from the drain to the source of the transistor, and a feedback tuning circuit receiving the first and second output signal, and tuning the current according to the first and second phase.

The present invention further provides a phase splitter comprising a first transistor of a first type having a gate receiving an input signal, a drain and source outputting a first and second output signal with a first and second phase, respectively, a second transistor of the first type having a drain coupledto the source of the first transistor and a source receiving a first voltage, a third transistor of the first type having a drain and gate commonly coupledto a gate of the second transistor, and a source receiving the first voltage, a fourth transistor of a second type having a drain and gate coupled together, and a source receiving a second voltage, a fifth transistor of the second type having a gate coupled to the gate of the fourth transistor, a source receiving the second voltage and a drain coupled to the drain of the first transistor, a resistor coupled between the drains of the third and fourth transistor, a capacitor having two ends respectively coupled to the gate of the second transistor and receiving the first voltage, and a feedback tuning circuit receiving the first and second output signal, and generating a third voltage to the gate of the second transistor corresponding to the first and second phase.

The present invention also provides a phase splitter comprising a first transistor of a first type having a gate receiving an input signal, a drain and source outputting a first and second output signal with a first and second phase, respectively, a second transistor of the first type having a drain coupled to the source of the first transistor and a source receiving a first voltage, a third transistor of the first type having a drain and gate commonly coupled to a gate of the second transistor, and a source receiving the first voltage, a fourth transistor of a second type having a drain and gate commonly coupled to the drain of the third transistor, and a source receiving a second voltage, a fifth transistor of the first type having a gate and drain coupled together, a source receiving the first voltage, a sixth transistor of the second type having a gate and drain commonly coupled to the drain of the fifth transistor, and a source receiving the second voltage, a seventh transistor of the second type having a source receiving the second voltage, a gate coupled to the gate of the sixth transistor and a drain coupled to the drain of the first transistor, a capacitor having two ends respectively coupled to the gate of the second transistor and receiving the first voltage, and a feedback tuning circuit receiving the first and second output signal, and generating a third voltage to the gate of the second transistor corresponding to the first and second phase.

Thus, in the present invention, a feedback loop is achieved by a phase tuning circuit and a current source is used as an active load. The phase tuning circuit feeds back a voltage controlling the current of the current source, whereby the phase difference is more precise and tunable.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
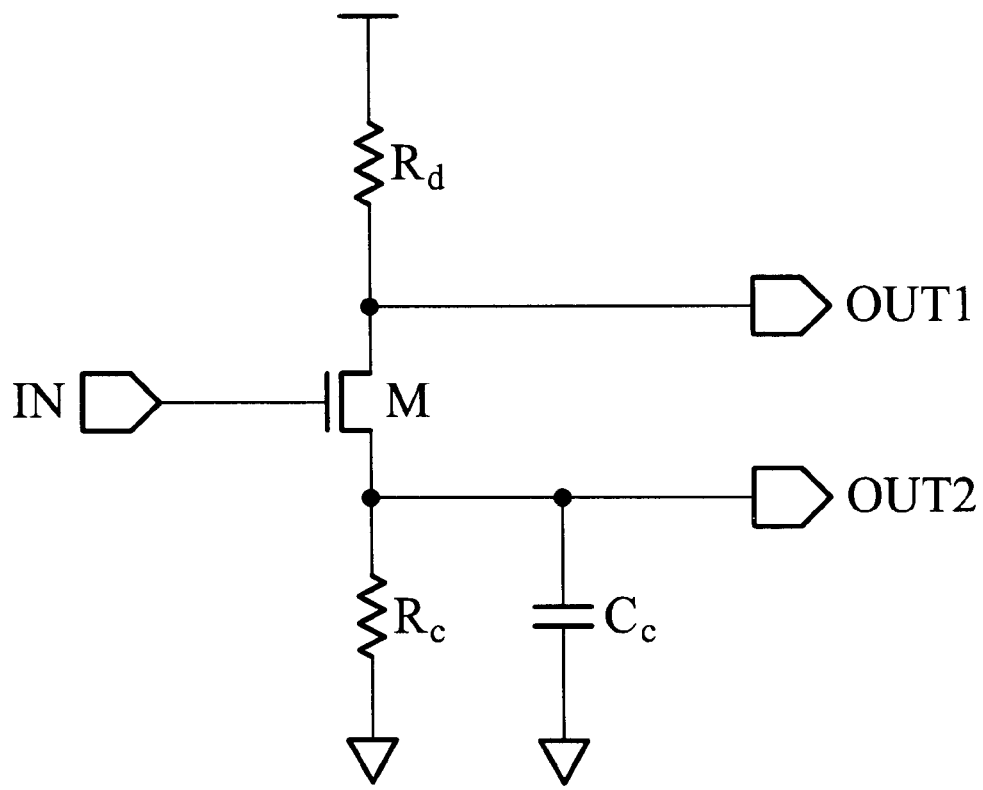
FIG. 1 shows a conventional phase splitter.
Figure 2:
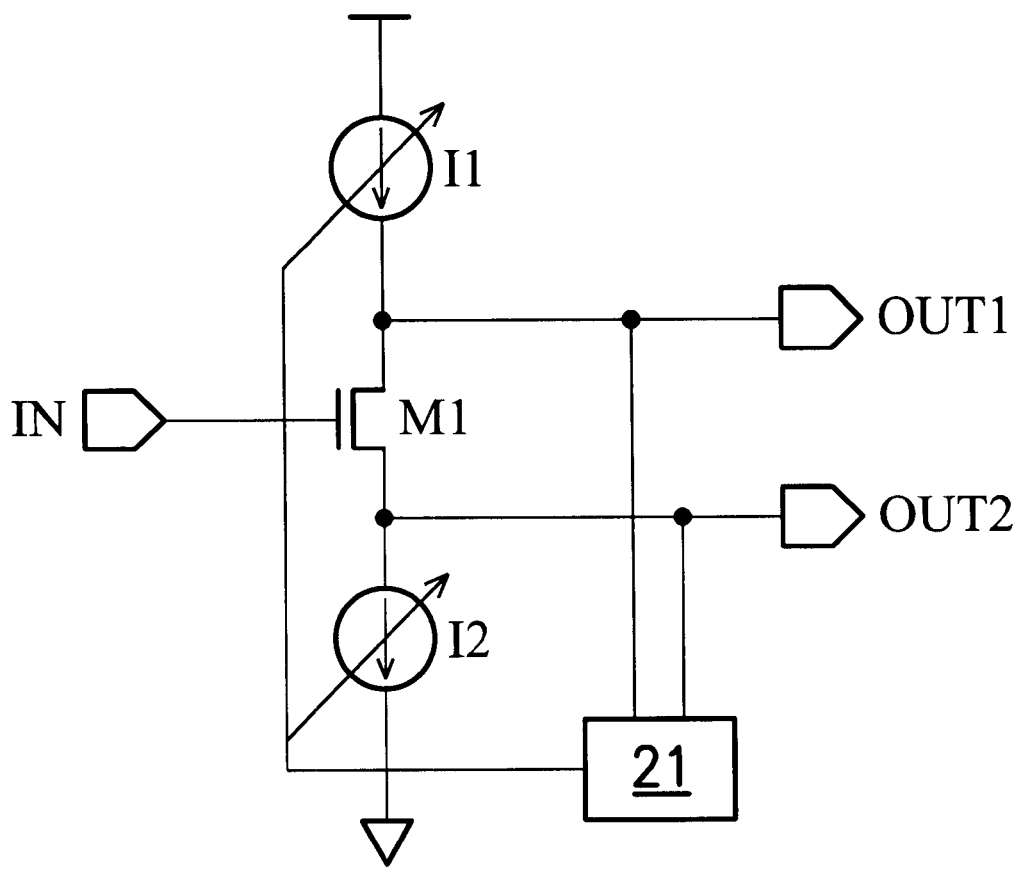
FIG. 2 shows a phase splitter according to a first embodiment of the invention.

FIG.2 is a diagram showing a phase splitter according to a first embodiment of the invention. It includes a transistor M1, controllable current sources I1 and I2, and a feedback tuning circuit 21. The transistor M1 has a gate receiving an input signal IN a drain and source generating output signals OUT1 and OUT2 with phases P1 and P2, respectively. The current sources I1 and I2 provide a current flowing from the drain to the source of the transistor M1. The feedback tuning circuit 21 receives the output signals OUT1 and OUT2, and tuning the current provided by the current sources I1 and I2 according to the phases P1 and P2.

In the first embodiment, since the transistor M1 has an active load and the feedback tuning circuit 21 is used, there are several advantages, such as:

1. A smaller circuit area due to the use of the active load.
2. A precise phase difference.
3. A tunable phase difference.

4. Compatibilty in RF-IC design.
5. Applications in multi-phase PLL, Ethernet PHY and RF-IC.

Figure 3:
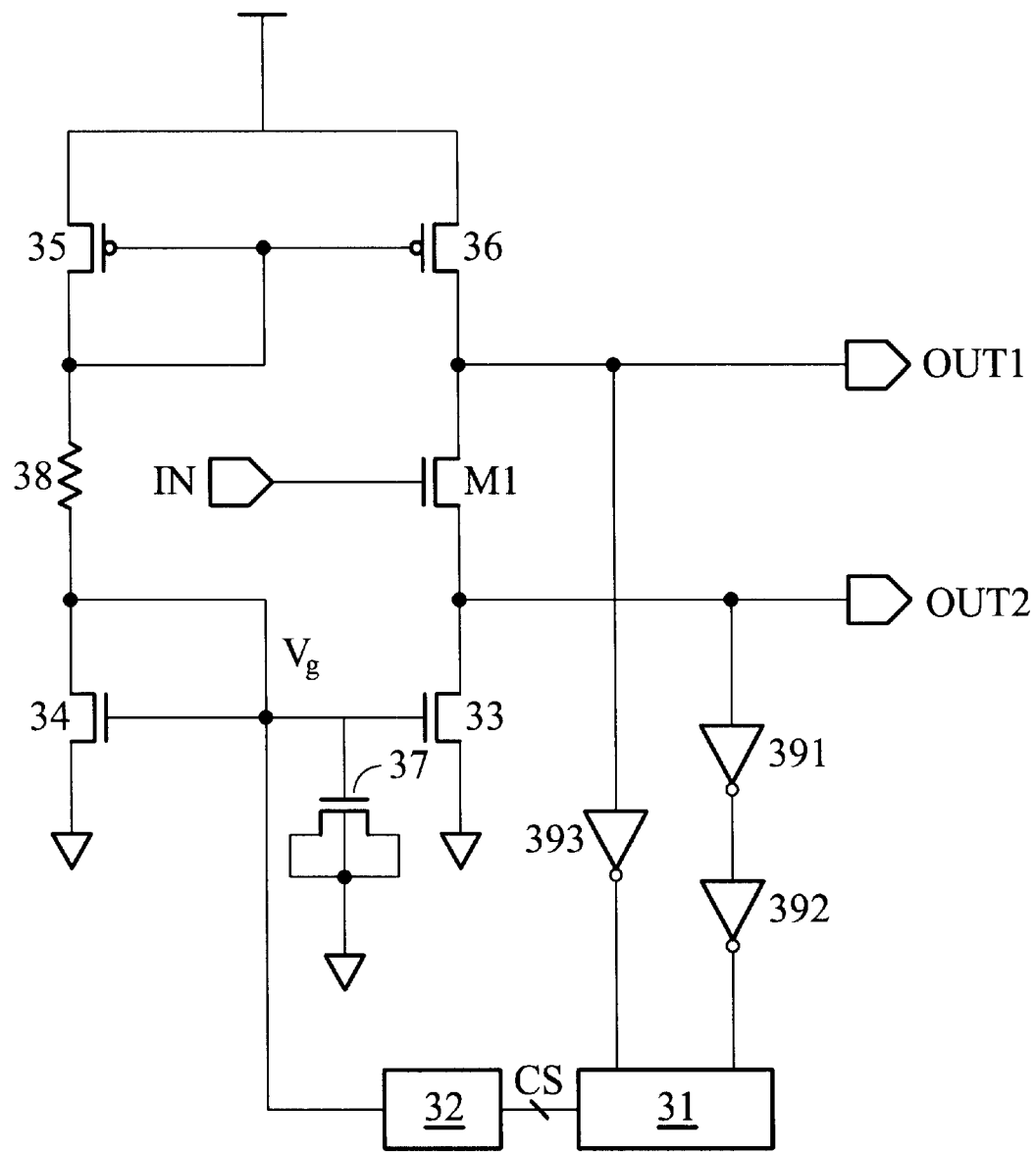
FIG. 3 shows a phase splitter according to a second embodiment of the invention.

FIG.3 shows a phase splitter according to a second embodiment of the invention. It includes N-type transistors M1, 33, 34 and 37, P-type transistors 35 and 36, inverters 391~393, a phase detector 31, a phase correction circuit 32 and a resistor 38. The transistor M1 has a gate receiving an input signal IN, a drain and source generating output signals OUT1 and OUT2 with phases P1 and P2, respectively. The transistor 33 has a drain coupled to the source of the transistor M1 and a source receiving a power supply voltage Vss. The transistor 34 has a drain and gate commonly coupled to a gate of the transistor 33, and a source receiving voltage Vss. The transistor 35 has a drain and gate coupled together, and a source receiving a power supply voltage Vdd. The transistor 36 has a gate coupled to the gate of the transistor 35, a source receiving the voltage Vdd and a drain coupled to the drain of the transistor M1. The resistor is coupled between the drains of the transistors 34 and 35. The transistor 37 has a bulk, source and drain commonly coupled to receive the voltage Vss, and a gate coupled to the gate of the transistor 33. The transistor 37 is used as a capacitor. The inverters 393 and 391 receive the output signals OUT1 and OUT2, and output their inverted signals, respectively. The inverter 392 is coupled to the inverter 391, receives the inverted signal of the output signal OUT2 and outputs the original output signal OUT2. The phase detector 31 receives the output signal OUT2 and the inverted signal of the output signal OUT1, and generates a correction signal CS by comparison of the phases P1 and P2. The phase correction circuit 32 generates a voltage Vg to the gate of the transistor 33 corresponding to the correction signal CS.

In the second embodiment, a current mirror is formed by the transistors 34 and 35, and the resistor 38 and generates the current through the transistor M1. The magnitude of the current flowing through the transistor M1 is determined by the voltage Vg. Thus, the difference between the phases P1 and P2 is tunable.

Figure 4:
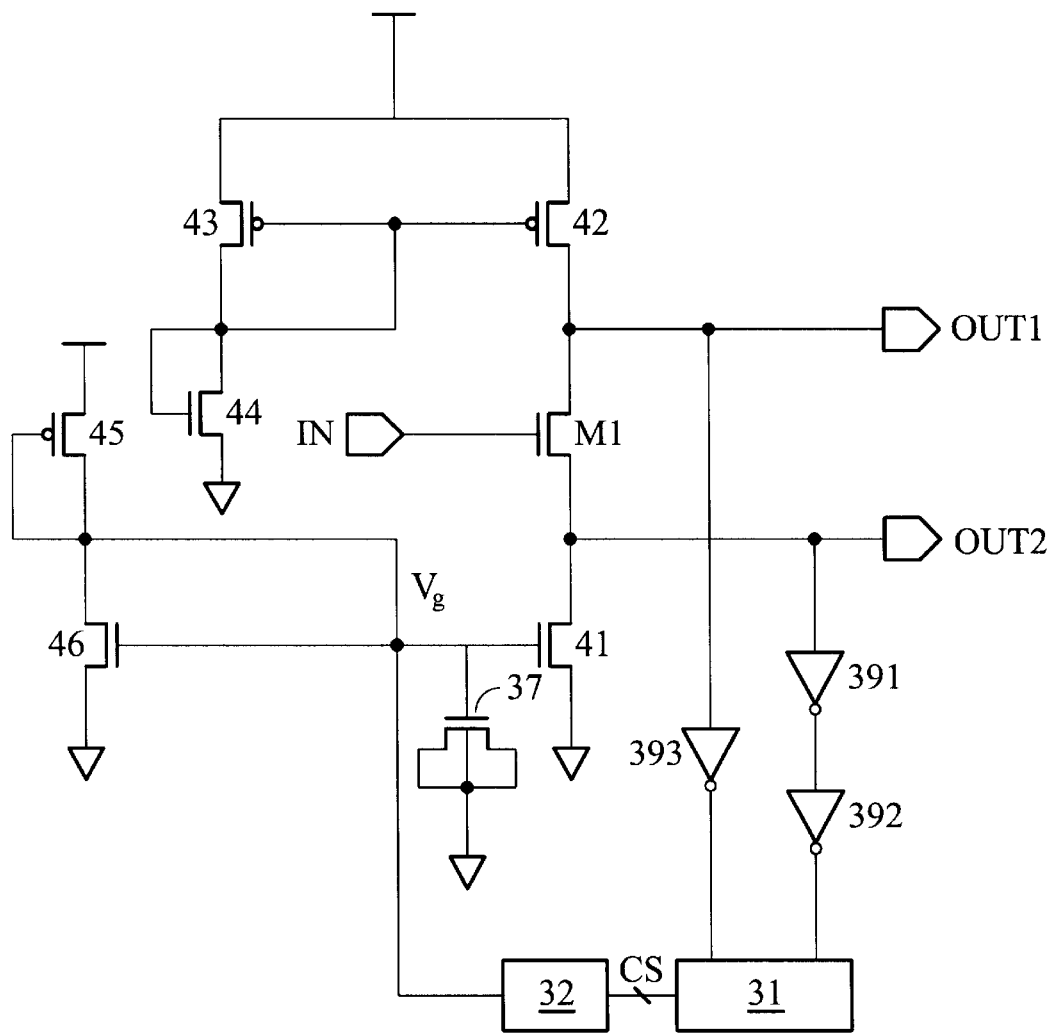
FIG. 4 shows a phase splitter according to a third embodiment of the invention.

FIG.4 shows a phase splitter according to a third embodiment of the invention. It includes N-type transistors M1, 37, 41, 44 and 46, P-type transistors 42, 43 and 45, inverters 391~393, a phase detector 31, a phase correction circuit 32. The transistor M1 has a gate receiving an input signal IN, a drain and source generating output signals OUT1 and OUT2 with phases P1 and P2, respectively. The transistor 41 has a drain coupled to the source of the transistor M1 and a source receiving a power supply voltage Vss. The transistor 46 has a drain and gate commonly coupled to a gate of the transistor 41, and a source receiving voltage Vss. The transistor 45 has a drain and gate commonly coupled to the drain of the transistor 46, and a source receiving a power supply voltage Vdd. The transistor 44 has a drain and gate coupled together, and a source receiving the voltage Vss. The transistor 43 has a gate and drain commonly coupled to the drain of the transistor 44, and a source receiving the voltage Vdd. The transistor 42 has a gate coupled to the gate of the transistor 43, a source receiving the voltage Vdd and a drain coupled to the drain of the transistor M1. The transistor 37 has a bulk, source and drain commonly coupled to receive the voltage Vss, and a gate coupled to the gate of the transistor 41. The transistor 37 is used as a capacitor. The inverters 393 and 391 receive the output signals OUT1 and OUT2, and output their inverted signals, respectively. The inverter 392 is coupled to the inverter 391, receives the inverted signal of the output signal OUT2 and outputs the original output signal OUT2. The phase detector 31 receives the output signal OUT2 and the inverted signal of the output signal OUT1, and generates a correction signal CS by comparison of the phases P1 and P2. The phase correction circuit 32 generates a voltage Vg to the gate of the transistor 41 corresponding to the correction signal CS.

By comparing the circuits in the second and third embodiment, it is noted that there are two current mirrors respectively formed by the transistors 43 and 44, and 45 and 46 in the third embodiment. The magnitudes of the currents provided by the two current mirrors are determined by the voltage Vg. Thus, the difference between the phases P1 and P2 is tunable.

Figure 5:
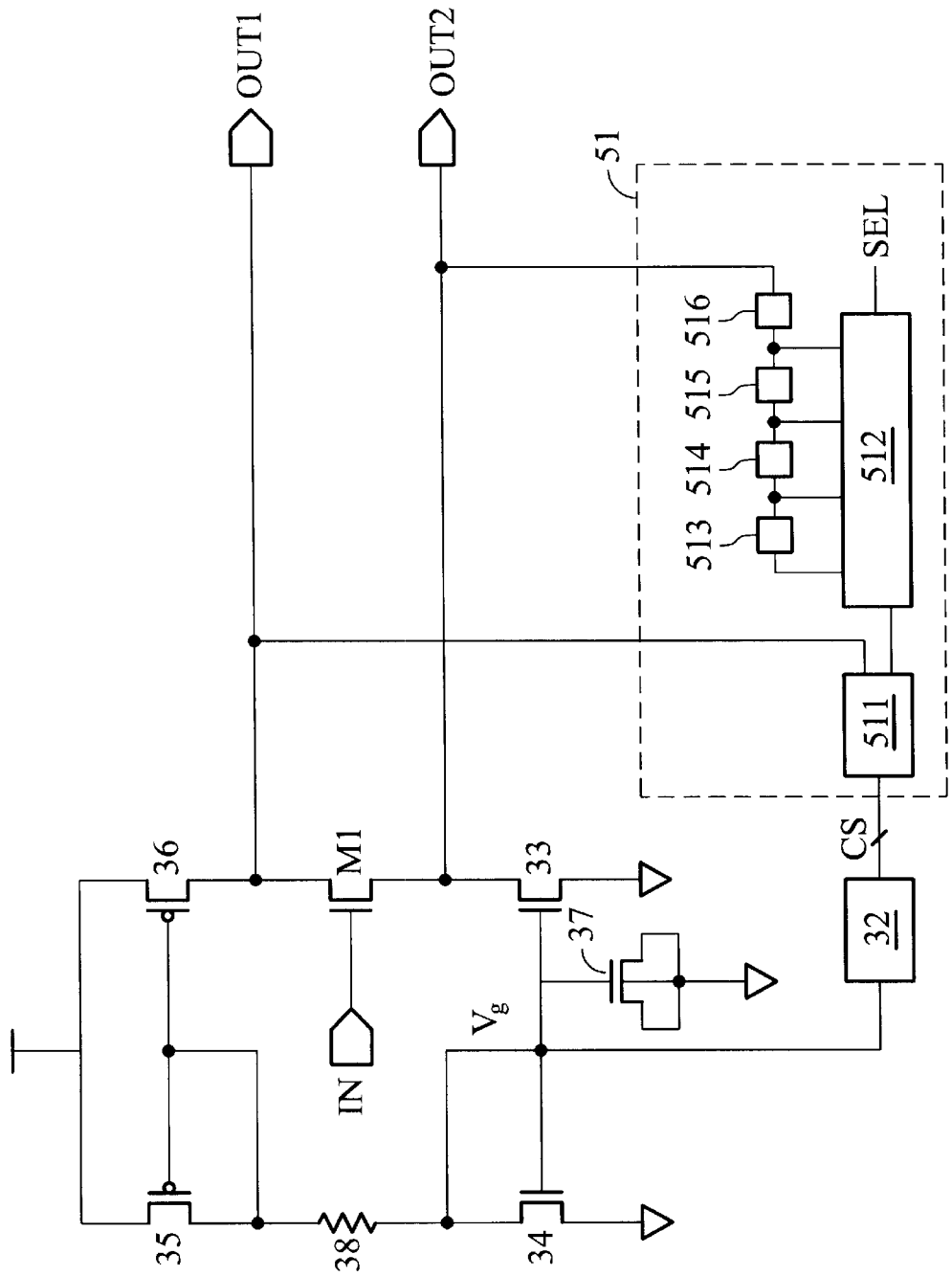
FIG. 5 shows a phase splitter according to a fourth embodiment of the invention.

FIG.5 shows a phase splitter according to a fourth embodiment of the invention. It includes N-type transistors M1, 33, 34, 37, P-type transistors 35 and 36, a multi-phase pattern generator 51, a phase correction circuit 32 and resistor 38. It is noted that the circuit in the fourth embodiment is similar to that in the second embodiment except the multi-phase pattern generator 51. The descriptions of the same elements in the second and fourth embodiment are omitted for clarity and only the multi-phase pattern generator 51 will be explained in the following.

The multi-phase pattern generator 51 includes four delay circuit 513~516 (the number of the delay circuits may vary with the number of the desired phase differences), a multiplexer 512 and a phase detector 511. The delay circuits 513~516 are coupled in series. The delay circuit 516 receives the output signal OUT2 and delays the signal OUT2 to generate a signal S1 with a phase of P2+30°. The delay circuit 515 receives the signal S1 and delays the signal S1 to generate a signal S2 with a phase of P2+60°. Similarly, the phase of signals S3 and S4 are P2+90° and P2+12° respectively. The multiplexer 512 receives a selection signal SEL to selectively output one of the signals S1~S4. The phase detector 511 receives the output signal OUT1 and the signal (one of the signals S1~S4) output from the multiplexer 512, and compares the signals to generate a correction signal CS.

In the fourth embodiment, the phase difference between the output signals OUT1 and OUT2 is controlled by the selection signal SEL.

Figure 6:
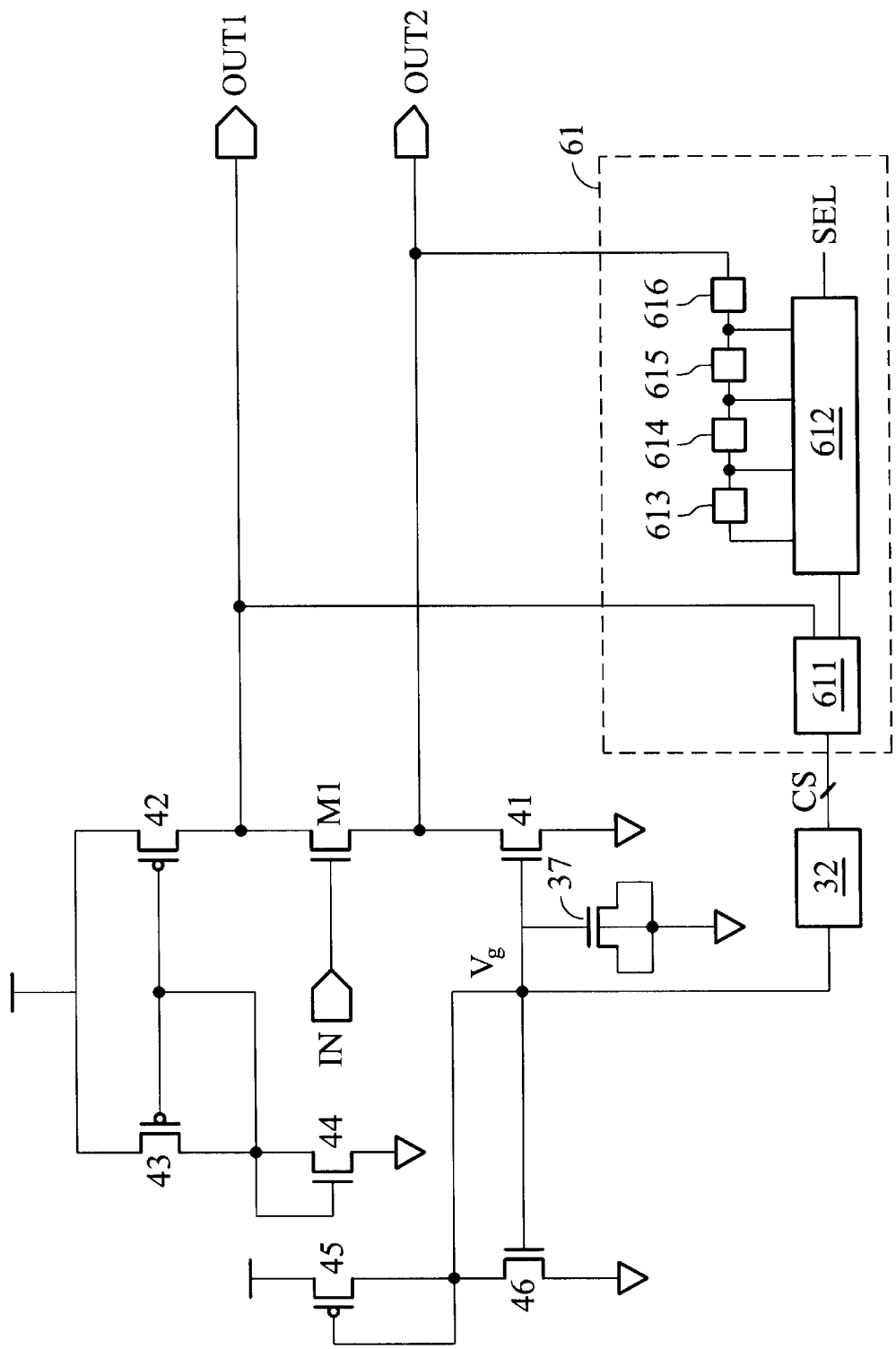
FIG. 6 shows a phase splitter according to a fifth embodiment of the invention.

FIG.6 shows a phase splitter according to a fifth embodiment of the invention. It includes N-type transistors M1, 37, 41, 44 and 46, P-type transistors 42, 43 and 45, inverters 391~393, a multi-phase pattern generator 61, a phase correction circuit 32. It is noted that the circuit in the fifth embodiment is similar to that in the third embodiment except the multi-phase pattern generator 61. The multi-phase pattern generators 51 and 61 in the third and fifth embodiment operate in the same way.

In conclusion, the present invention provides a phase splitter with active load and feedback tuning circuit. A feedback loop is achieved by a phase tuning circuit and a current source is used as an active load. The phase tuning circuit feeds back a voltage controlling the current of the current source. Thus, the phase difference is more precise and tunable, and the circuit area is smaller than that of the conventional phase splitter with passive load.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A phase splitter comprising:
   a transistor having a gate receiving an input signal, a drain and source outputting a first and second output signal with a first and second phase, respectively;
   a current source providing a current flowing from the drain to the source of the transistor; and
   a feedback tuning circuit receiving the first and second output signal, and tuning the current according to the first and second phase.

2. The phase splitter as claimed in claim 1, wherein the feedback tuning circuit comprises:
   a first and second inverter receiving the first and second output signal, and outputting the inverted first and second signal, respectively;
   a third inverter receiving the inverted second output signal and outputting the second output signal;
   a phase detector receiving the inverted first output signal and the second output signal, and generating a correction signal by comparison of the first and second phase; and
   a phase correction circuit generating a voltage corresponding to the correction signal, wherein the current provided by the current source corresponds to the voltage.

3. The phase splitter as claimed in claim 1, wherein the feedback tuning circuit comprises:
   a first and second delay circuit, the first delay circuit receiving the second output signal to generate a third signal with a third phase, and the second delay circuit receiving the third signal to generate a fourth signal with a fourth phase;
   a multiplexer receiving the third and fourth signal, and outputting the third or fourth signal according to a selection signal;
   a phase detector receiving the first output signal, and the third or fourth signal output from the multiplexer, and generating a correction signal by comparison of the first phase and the third or fourth phase; and
   a phase correction circuit generating a voltage corresponding to the correction signal, wherein the current provided by the current source corresponds to the voltage.

4. A phase splitter comprising:
   a first transistor of a first type having a gate receiving an input signal, a drain and source outputting a first and second output signal with a first and second phase, respectively;
   a second transistor of the first type having a drain coupled to the source of the first transistor and a source receiving a first voltage;
   a third transistor of the first type having a drain and gate commonly coupled to a gate of the second transistor, and a source receiving the first voltage;
   a fourth transistor of a second type having a drain and gate coupled together, and a source receiving a second voltage;
   a fifth transistor of the second type having a gate coupled to the gate of the fourth transistor, a source receiving the second voltage and a drain coupled to the drain of the first transistor;
   a resistor coupled between the drains of the third and fourth transistor;
   a capacitor having two ends respectively coupled to the gate of the second transistor and receiving the first voltage; and
   a feedback tuning circuit receiving the first and second output signal, and generating a third voltage to the gate of the second transistor corresponding to the first and second phase.

5. The phase splitter as claimed in claim 4, wherein the feedback tuning circuit comprises:
   a first and second inverter receiving the first and second output signal, and outputting the inverted first and second signal, respectively;
   a third inverter receiving the inverted second output signal and outputting the second output signal;
   a phase detector receiving the inverted first output signal and the second output signal, and generating a correction signal by comparison of the first and second phase; and
   a phase correction circuit generating the third voltage to the gate of the second transistor corresponding to the correction signal.

6. The phase splitter as claimed in claim 4, wherein the feedback tuning circuit comprises:
   a first and second delay circuit, the first delay circuit receiving the second output signal to generate a third signal with a third phase, and the second delay circuit receiving the third signal to generate a fourth signal with a fourth phase;
   a multiplexer receiving the third and fourth signal, and outputting the third or fourth signal according to a selection signal;
   a phase detector receiving the first output signal, and the third or fourth signal output from the multiplexer, and generating a correction signal by comparison of the first phase and the third or fourth phase; and
   a phase correction circuit generating the third voltage to the gate of the second transistor corresponding to the correction signal.

7. The phase splitter as claimed in claim 4, wherein the first type is N type and the second type is P type.

8. A phase splitter comprising:
   a first transistor of a first type having a gate receiving an input signal, a drain and source outputting a first and second output signal with a first and second phase, respectively;
   a second transistor of the first type having a drain coupled to the source of the first transistor and a source receiving a first voltage;
   a third transistor of the first type having a drain and gate commonly coupled to a gate of the second transistor, and a source receiving the first voltage;
   a fourth transistor of a second type having a drain and gate commonly coupled to the drain of the third transistor, and a source receiving a second voltage;
   a fifth transistor of the first type having a gate and drain coupled together, a source receiving the first voltage;
   a sixth transistor of the second type having a gate and drain commonly coupled to the drain of the fifth transistor, and a source receiving the second voltage;
   a seventh transistor of the second type having a source receiving the second voltage, a gate coupled to the gate of the sixth transistor and a drain coupled to the drain of the first transistor;

a capacitor having two ends respectively coupled to the gate of the second transistor and receiving the first voltage; and a feedback tuning circuit receiving the first and second output signal, and generating a third voltage to the gate of the second transistor corresponding to the first and second phase.

9. The phase splitter as claimed in claim 8, wherein the feedback tuning circuit comprises:

a first and second inverter receiving the first and second output signal, and outputting the inverted first and second signal, respectively;

a third inverter receiving the inverted second output signal and outputting the second output signal;

a phase detector receiving the inverted first output signal and the second output signal, and generating a correction signal by comparison of the first and second phase; and a phase correction circuit generating the third voltage to the gate of the second transistor corresponding to the correction signal.

10. The phase splitter as claimed in claim 8, wherein the feedback tuning circuit comprises:

a first and second delay circuit, the first delay circuit receiving the second output signal to generate a third signal with a third phase, and the second delay circuit receiving the third signal to generate a fourth signal with a fourth phase;

a multiplexer receiving the third and fourth signal, and outputting the third or fourth signal according to a selection signal;

a phase detector receiving the first output signal, and the third or fourth signal output from the multiplexer, and generating a correction signal by comparison of the first phase and the third or fourth phase; and a phase correction circuit generating the third voltage to the gate of the second transistor corresponding to the correction signal.

11. The phase splitter as claimed in claim 8, wherein the first type is N type and the second type is P type.

* * * * *